United States Patent
Li et al.

(10) Patent No.: US 11,394,389 B2
(45) Date of Patent: Jul. 19, 2022

(54) BUFFER CIRCUIT AND BUFFER

(71) Applicant: NO.24 RESEARCH INSTITUTE OF CHINA ELECTRONICS TECHNOLOGY GROUP CORPORATION, Chongqing (CN)

(72) Inventors: Ting Li, Chongqing (CN); Gangyi Hu, Chongqing (CN); Ruzhang Li, Chongqing (CN); Yong Zhang, Chongqing (CN); Zhengbo Huang, Chongqing (CN); Yabo Ni, Chongqing (CN); Xingfa Huang, Chongqing (CN); Jian'an Wang, Chongqing (CN); Guangbing Chen, Chongqing (CN); Dongbing Fu, Chongqing (CN); Jun Yuan, Chongqing (CN); Zicheng Xu, Sichuan (CN)

(73) Assignee: NO.24 RESEARCH INSTITUTE OF CHINA ELECTRONICS TECHNOLOGY GROUP CORPORATION, Chongqing (CN)

(*) Notice: Subject to any disclaimer, the term of this patent is extended or adjusted under 35 U.S.C. 154(b) by 0 days.

(21) Appl. No.: 17/258,165

(22) PCT Filed: Dec. 13, 2018

(86) PCT No.: PCT/CN2018/120786
§ 371 (c)(1),
(2) Date: Jan. 6, 2021

(87) PCT Pub. No.: WO2020/042436
PCT Pub. Date: Mar. 5, 2020

(65) Prior Publication Data
US 2021/0281269 A1    Sep. 9, 2021

(30) Foreign Application Priority Data

Aug. 27, 2018 (CN) .......................... 201810979069.1

(51) Int. Cl.
*H03M 1/06* (2006.01)
*H03K 5/02* (2006.01)
*H03K 17/687* (2006.01)

(52) U.S. Cl.
CPC ................ *H03M 1/06* (2013.01); *H03K 5/02* (2013.01); *H03K 17/6871* (2013.01)

(58) Field of Classification Search
CPC ...... H03M 1/06; H03M 1/0863; H03M 1/124; H03M 1/0607; H03K 5/02; H03K 17/6871

(Continued)

(56) References Cited

U.S. PATENT DOCUMENTS

2018/0332377 A1* 11/2018 Polo .................... H03F 3/45475

FOREIGN PATENT DOCUMENTS

| CN | 102931972 A | 2/2013 |
| CN | 103888127 A | 6/2014 |

(Continued)

*Primary Examiner* — Metasebia T Retebo

(57) ABSTRACT

The present disclosure provides a buffer circuit and a buffer. The buffer circuit includes: an input follower circuit for following the voltage change of the first input signal; an input follower linearity boosting circuit for improving follower linearity of the input follower circuit; a first voltage bootstrap circuit for bootstrapping the voltage of the first input signal; a second voltage bootstrap circuit for bootstrapping the voltage of the second input signal; a third voltage bootstrap circuit for providing corresponding quiescent operation point voltage; a compensation follower circuit for following the compensation voltage; a compensation follower linearity boosting circuit for improving follower linearity of the compensation follower circuit; a first load for collecting the buffered voltage; a bias circuit for providing a bias current for the buffer; a bias linearity boosting circuit for improving linearity of the bias circuit; a (Continued)

second load for generating a nonlinear compensation current.

30 Claims, 5 Drawing Sheets

(58) Field of Classification Search
USPC .......................................................... 327/306
See application file for complete search history.

(56) References Cited

FOREIGN PATENT DOCUMENTS

| | | |
|---|---|---|
| CN | 104467850 A | 3/2015 |
| CN | 106656161 A | 5/2017 |

* cited by examiner

BUFFER CIRCUIT AND BUFFER

CROSS REFERENCE TO RELATED APPLICATION

This is a Sect. 371 National Stage of PCT International Application No. PCT/CN2018/120786, filed on 13 Dec. 2018, which claims priority of a Chinese Patent Application No. 2018109790691 filed on 27 Aug. 2018, the contents of which are incorporated herein by reference in its entirety for all purposes.

BACKGROUND

Field of Disclosure

The present disclosure relates to the field of integrated circuits, in particular, to a highly linear input buffer circuit and a buffer, which are directly applied to an analog or mixed signal circuit for buffering an input signal, and are particularly suitable for a highly linear analog-to-digital converter.

Description of Related Arts

In the design of analog-to-digital converters, as the sampling speed continues to increase, the kick back effect of the sampling capacitor on the signal source becomes more significant, resulting in a decrease in the sampling linearity of the A/D (analog to digital) converter. To solve this problem, an input buffer needs to be added at the front end of the A/D converter to isolate the signal source and the sampling capacitor. However, although the traditional input buffer increases the isolation, its non-linearity will cause the linearity of the entire A/D converter to decrease. Referring to FIG. 1, since the bias voltage (Vbias) does not change with the input voltage (Vin), the bias current on the current source transistor M12 does not change, the current on the sampling capacitor (Cs) changes with the Vin, causing the current on the follower transistor M11 to change with the Vin. Thus the source impedance of M11 changes with Vin, that is, the impedance on the sampling network changes with Vin, which is the main reason for follower nonlinearity.

To improve linearity, the traditional solution is to increase the bias current of the input buffer, that is, increase the current of M12. Since the current I11 of M11 is the sum of the current I12 of M12 and the current Ics of Cs, the ratio of Ics in I11 is reduced to reduce the impact of the change of Ics on I11 by increasing I12. This can reduce the change of the sampling network impedance with Vin.

However, the traditional solution has the following problems:

(1) The power consumption is high. The increase in power consumption does not improve linearity significantly. The multiple of increased linearity is proportional to power consumption. For example, the increase of 6 dB linearity requires 2 times power consumption, and the increase of 12 dB linearity requires 4 times power consumption.

(2) Channel modulation leads to serious nonlinearity. M11 drain-source voltage changes with Vin. For MOS devices in advanced technology, the channel is very short, so the channel modulation effect is more serious, which further leads to a decrease in linearity.

(3) The bandwidth is unadjustable. Since all devices have a fixed size, the output impedance of the buffer is not adjustable, making the bandwidth of the sampling network unadjustable and the application range not wide.

Based on the above, a low-power linearity improvement technology suitable for input buffers is needed to achieve high linearity, low power consumption, and output signal bandwidth configurable input buffers, to meet the design requirements of high-performance analog integrated circuits and mixed signal integration circuits.

SUMMARY

The present disclosure provides a buffer circuit and a buffer, to solve the problems of low linearity, high power consumption, and non-configurable output signal amplitude and bandwidth.

The present disclosure provides a buffer circuit, which includes an input follower circuit, an input follower linearity boosting circuit, a first voltage bootstrap circuit, a second voltage bootstrap circuit, a third voltage bootstrap circuit, a compensation follower circuit, a compensation follower linearity boosting circuit, a first load, a bias circuit, a bias linearity boosting circuit, and a second load.

The input end of the input follower circuit is connected with a first input signal to follow a voltage change of the first input signal.

The input follower linearity boosting circuit is connected with the input follower circuit and a first voltage bootstrap circuit, to improve follower linearity of the input follower circuit;

The first voltage bootstrap circuit is connected between the first input signal and the input follower linearity boosting circuit, a difference between an output voltage and an input voltage of the first voltage bootstrap circuit is a fixed level, to provide a corresponding quiescent point voltage for the input follower linearity boosting circuit;

An input end of the second voltage bootstrap circuit is connected with a second input signal, and an output end of the second voltage bootstrap circuit is connected with an input end of a compensation follower circuit, a difference between an output voltage and an input voltage of the second voltage bootstrap circuit is a fixed level, to provide a corresponding quiescent point for the compensation follower circuit, the second input signal and the first input signal are equal in magnitude and opposite in direction;

An input end of the third voltage bootstrap circuit is connected with the output end of the second voltage bootstrap circuit, to provide a corresponding quiescent point voltage for a compensation follower linearity boosting circuit;

An input end of the compensation follower circuit is connected with the output end of the second voltage bootstrap circuit, to follow a compensation voltage being bootstrapped by the second voltage bootstrap circuit;

An input end of the compensation follower linearity boosting circuit is connected with an output end of the third voltage bootstrap circuit, to improve follower linearity of the compensation follower circuit;

The first load is connected in parallel between the input follower circuit and the compensation follower linearity boosting circuit to collect a buffered voltage;

An input end of the bias circuit is connected with a bias voltage, to provide a bias current for the buffer;

The bias linearity boosting circuit is connected between the compensation follower circuit and the bias circuit, to improve the linearity of the bias circuit; and The second load is connected in parallel between the compensation follower circuit and the bias linearity boosting circuit to generate a nonlinear compensation current.

The present disclosure further provides a buffer circuit that generates one or two nonlinear compensation currents in single-ended or differential form.

The present disclosure further provides a buffer including the above buffer circuit.

As described above, the buffer circuit and the buffer of the present disclosure have the following beneficial effects:

In the input buffer of the present disclosure, the channel-modulation effect is avoided through the drain-source voltages of the constant input follower circuit and the compensation follower circuit, which is particularly suitable for small-sized processes. At the same time, in the buffer circuit, the first input signal is followed by the input follower circuit to generate a first current on the first load, the second input signal adjusts the voltage through the second and third voltage bootstrap circuits, and the compensation follower circuit follows the second load to generate a second current. The AC voltages of the first load and the second load are equal in the opposite direction, if the impedances of the two loads are the same, the first current and the second current are also the same in the opposite direction. The sum of the AC currents flowing out of the input follower circuit is zero, thereby ensuring that the current of the input follower circuit does not change with the input signal, so there is no following nonlinearity. Without increasing the current, the input follower circuit of the present disclosure has no nonlinearity. Compared with the traditional input buffer, the linearity is improved by more than 10 dB, which saves about 70% of power consumption.

The number of components in the input follower circuit, the compensation follower circuit, and the bias circuit of the present disclosure are adjusted by the number of switches being turned on and off, to achieve a compromise design between the buffer output impedance and power consumption. When the input signal frequency is low, the number of components in the input follower circuit, compensation follower circuit, and bias circuit can be reduced to achieve lower power consumption. When the input signal frequency is high, the number of components in the input follower circuit, compensation follower circuit, and the bias circuit can be increased to achieve a lower output impedance.

Figure 1:
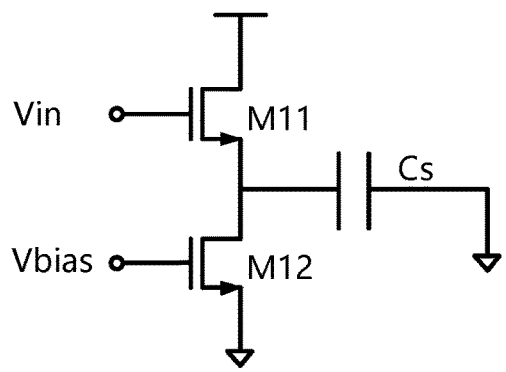
FIG. 1 shows a circuit diagram of a conventional input buffer.

Description of Component Mark Numbers:
1 Input follower circuit
2 Input follower linearity boosting circuit
3 Compensation follower circuit
4 Compensation follower linearity boosting circuit
5 Bias circuit
6 Bias linearity boosting circuit
7 First voltage bootstrap circuit
8 Second voltage bootstrap circuit
9 Third voltage bootstrap circuit
10 First load
11 Second load

DETAILED DESCRIPTION OF THE PREFERRED EMBODIMENTS

The embodiments of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure. It needs to be stated that the following embodiments and the features in the embodiments can be combined under the situation of no conflict.

It needs to be stated that the drawings provided in the following embodiments are just used for schematically describing the basic concept of the present disclosure, thus only illustrating components only related to the present disclosure and are not drawn according to the numbers, shapes, and sizes of components during actual implementation, the configuration, number and scale of each component during the actual implementation thereof may be freely changed, and the component layout configuration thereof may be more complicated.

Figure 2:
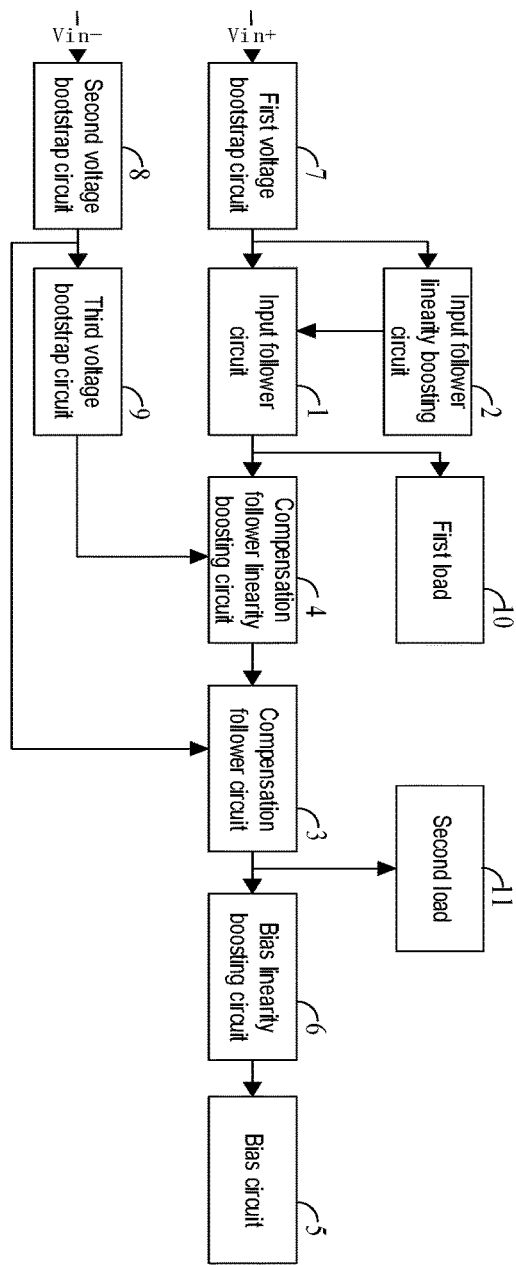
FIG. 2 shows a block diagram of an input buffer according to the present disclosure.

Referring to FIG. 2, which shows a block diagram of an input buffer of the present disclosure. The input buffer includes an input follower circuit 1, an input follower linearity boosting circuit 2, a first voltage bootstrap circuit 7, a second voltage bootstrap circuit 8, a third voltage bootstrap circuit 9, a compensation follower circuit 3, a compensation follower linearity boosting circuit 4, a first load 10, a bias circuit 5, a bias linearity boosting circuit 6, and a second load 11.

An input end of the input follower circuit 1 is connected with a first input signal to follow a voltage change of the first input signal.

Specifically, in the embodiment, the G end of the input follower circuit 1 is connected with the first input signal.

The input follower linearity boosting circuit 2 is connected with the input follower circuit 1 and a first voltage bootstrap circuit 7, to improve follower linearity of the input follower circuit 1.

The first voltage bootstrap circuit 7 is connected between the first input signal and the input follower linearity boosting circuit 2, a difference between an output voltage and an input voltage of the first voltage bootstrap circuit 7 is a fixed level, to provide a corresponding quiescent point voltage for the input follower linearity boosting circuit 2.

An input end of the second voltage bootstrap circuit 8 is connected with a second input signal, and an output end of the second voltage bootstrap circuit 8 is connected with an input end of a compensation follower circuit 3, a difference between an output voltage and an input voltage of the second voltage bootstrap circuit is a fixed level, to provide a corresponding quiescent operation point for the compensation follower circuit 3. The second input signal and the first input signal are equal in magnitude and opposite in direction.

Specifically, in the embodiment, the input end of the second voltage bootstrap circuit 8 is connected with the second input signal (i.e. the compensation voltage), and the output end of the second voltage bootstrap circuit 8 is connected with the G end of the compensation follower circuit 3.

An input end of the third voltage bootstrap circuit 9 is connected with the output end of the second voltage bootstrap circuit 7, to provide a corresponding quiescent point voltage for a compensation follower linearity boost circuit 4.

An input end of the compensation follower circuit 3 is connected with the output end of the second voltage bootstrap circuit 8, to follow a compensation voltage being bootstrapped by the second voltage bootstrap circuit.

Specifically, in the embodiment, the G end of the compensation follower circuit 3 is connected with the output end of the second voltage bootstrap circuit 8.

An input end of the compensation follower linearity boosting circuit 4 is connected with an output end of the third voltage bootstrap circuit 9, to improve follower linearity of the compensation follower circuit.

Specifically, in the embodiment, the G end of the compensation follower linearity boosting circuit 4 is connected with the output terminal of the third voltage bootstrap circuit 9.

The first load 10 is connected in parallel between the input follower circuit 1 and the compensation follower linearity boosting circuit 4 to collect a buffered voltage.

An input end of the bias circuit 5 is connected with a bias voltage, to provide a bias current for the buffer.

Specifically, in the embodiment, the G end of the bias circuit 5 is connected with the bias voltage.

The bias linearity boosting circuit 6 is connected between the compensation follower circuit and the bias circuit, to improve the linearity of the bias circuit.

The second load 11 is connected in parallel between the compensation follower circuit and the bias linearity boosting circuit to generate a nonlinear compensation current.

In this embodiment, in the input buffer of the present disclosure, the channel-modulation effect is avoided through the drain-source voltages of the constant input follower circuit and the compensation follower circuit, which is particularly suitable for small-sized processes. At the same time, in the buffer circuit, the first input signal is followed by the input follower circuit to generate a first current on the first load, the second input signal adjusts the voltage through the second and third voltage bootstrap circuits and the compensation follower circuit follows the second load to generate a second current. The AC voltages of the first load and the second load are equal in the opposite direction, if the impedances of the two loads are the same, the first current and the second current are also the same in the opposite direction. The sum of the AC currents flowing out of the input follower circuit is zero, thereby ensuring that the current of the input follower circuit does not change with the change of the input signal, so there is no following nonlinearity.

Figure 3:
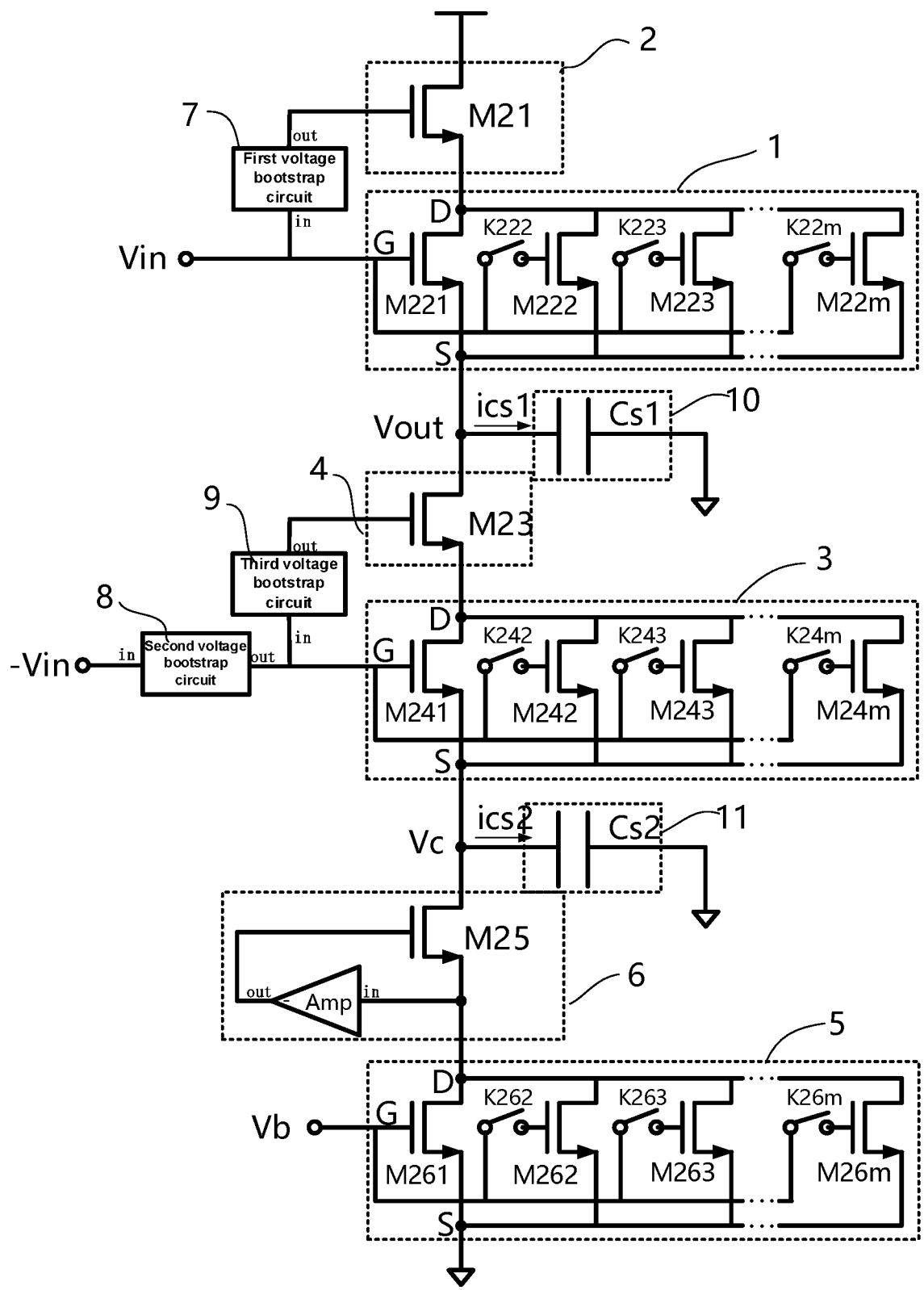
FIG. 3 shows a circuit diagram of an input buffer according to the present disclosure.

In embodiment 1, as shown in FIG. 3, which is a circuit diagram of the input buffer provided by the present disclosure. The input follower circuit includes m NMOS transistors (input follower transistors M221, M222, . . . , M22m) and m−1 control switches (K222, . . . , K22m). From the second NMOS transistor M222, the gate of each NMOS transistor is correspondingly connected with an end of a control switch, and the other end of all control switches and the gate of the first NMOS transistor are connected with the first input signal +Vin. The sources of all NMOS transistors are connected with the compensation follower linearity boosting circuit 4, and the drains of all NMOS transistors are connected with the input follower linearity boosting circuit 2.

The input follower linearity boosting circuit 2 includes at least one NMOS transistor. When the input follower linearity boosting circuit 2 includes only one NMOS transistor M21, the gate of the NMOS transistor M21 is connected with the output end of the first voltage bootstrap circuit, the drain of the NMOS transistor M21 is connected with the power supply voltage, and the source of the NMOS transistor M21 is connected with the D terminal of the input follower circuit to improve the follower linearity of the input follower circuit.

The input end of the first voltage bootstrap circuit 7 (input voltage bootstrap circuit) is connected with the first input signal +Vin, and the output end of the first voltage bootstrap circuit 7 is connected with the gate of the input follower linearity boosting circuit, to set an appropriate quiescent operation point voltage for the input follower linearity boosting circuit. The level between the input end and the output end of the first voltage bootstrap circuit is a fixed level. The source of the input follower linearity boosting circuit 2 is connected with the D terminal of the input follower circuit 1. The input follower linearity boosting circuit 2 and the first voltage bootstrap circuit 7 jointly ensure that the voltage difference between the D terminal and S terminal of the input follower circuit 1 is a fixed level, thereby eliminating the channel modulation effect of the input follower circuit 1 and enhancing its linearity.

The second voltage bootstrap circuit 8 is used to set an appropriate quiescent operation point operating voltage for the G terminal of the compensation follower circuit, and the difference between its output voltage and input voltage is a fixed level. The input end of the second voltage bootstrap circuit 8 is connected with the second input signal −Vin, and the output end of the second voltage bootstrap circuit 8 is connected with the input end of the third voltage bootstrap circuit 9 (compensation voltage bootstrap circuit) and the G terminal of the compensation follower circuit 3.

The compensation follower circuit 3 includes m NMOS transistors (input follower transistors M241, M242, . . . , M24m) and m−1 control switches (K242, . . . , K24m). From the second NMOS transistor M242, the gate of each NMOS transistor is correspondingly connected with a control switch, the other end of all control switches and the gate of the first NMOS transistor are connected with the voltage being bootstrapped by the second input signal (−Vin). The sources of all NMOS transistors are connected with the bias linearity boosting circuit 6, and the drains of all NMOS transistors are connected with the compensation follower linearity boosting circuit 4.

The compensation follower linearity boosting circuit 4 includes at least one NMOS transistor, when the compensation follower linearity boosting circuit 4 includes an NMOS transistor, the gate of the NMOS transistor is connected with the output end of the third voltage bootstrap circuit, the drain of the NMOS transistor is connected with the S pole of the input follower circuit, and the source of the NMOS transistor is connected with the D pole of the compensation follower circuit.

The first load CS1 is the load capacitor of the buffer, which is used for the sampling capacitor of the subsequent sampling circuit, the buffered voltage is Vout. The second load is the compensation capacitor, which is used to generate a nonlinear compensation current, to compensate the nonlinear current extracted by Cs1 from the input follower circuit, thereby improving the linearity of the buffer without increasing power consumption.

The bias circuit includes m NMOS transistors (input follower transistors M261, M262, . . . , M26m) and m–1 control switches (K262, . . . , K26m). From the second NMOS transistor M262, the gate of each NMOS transistor is correspondingly connected with a control switch, the other end of all control switches and the gate of the first NMOS transistor are connected with the bias voltage Vb. The sources of all NMOS transistors are grounded, and the drains of all NMOS transistors are connected with a bias linearity boosting circuit.

The bias linearity boosting circuit at least includes a bias linearity boosting unit, and each bias linearity boosting unit includes an amplifier Amp and an NMOS transistor. The input end and output end of the amplifier are correspondingly connected with the source and gate of the NMOS transistor. The source of the NMOS transistor is connected with the bias circuit, and the drain of the NMOS transistor is connected with the compensation follower circuit.

The bias linearity boosting circuit improves the linearity of the bias circuit and reduces the influence of the voltage change at the S terminal of the compensation follower circuit 3 on the voltage change at the D terminal of the bias circuit 5. The D terminal of the bias linearity boosting circuit is connected with the S terminal of the compensation follower circuit 3, and the S terminal of the bias linearity boosting circuit is connected with the D terminal of the bias circuit 5. The bias circuit 5 provides a bias current for the buffer.

The number of components in the input follower circuit 1, the compensation follower circuit 3, and the bias circuit 5 in the input buffer can be adjusted by the number of switches being turned on and off, to achieve a compromise design between the buffer output impedance and power consumption. When the input signal frequency is low, the number of components in the input follower circuit 1, compensation follower circuit 3, and bias circuit 5 can be reduced to achieve lower power consumption. When the input signal frequency is high, the number of components in the input follower circuit 1, compensation follower circuit 3, and bias circuit 5 can be increased to achieve a lower output impedance. The switches K222, K242, K262 are turned on or off simultaneously, . . . , K22m, K24m, K26m are turned on or off simultaneously.

Figure 4:
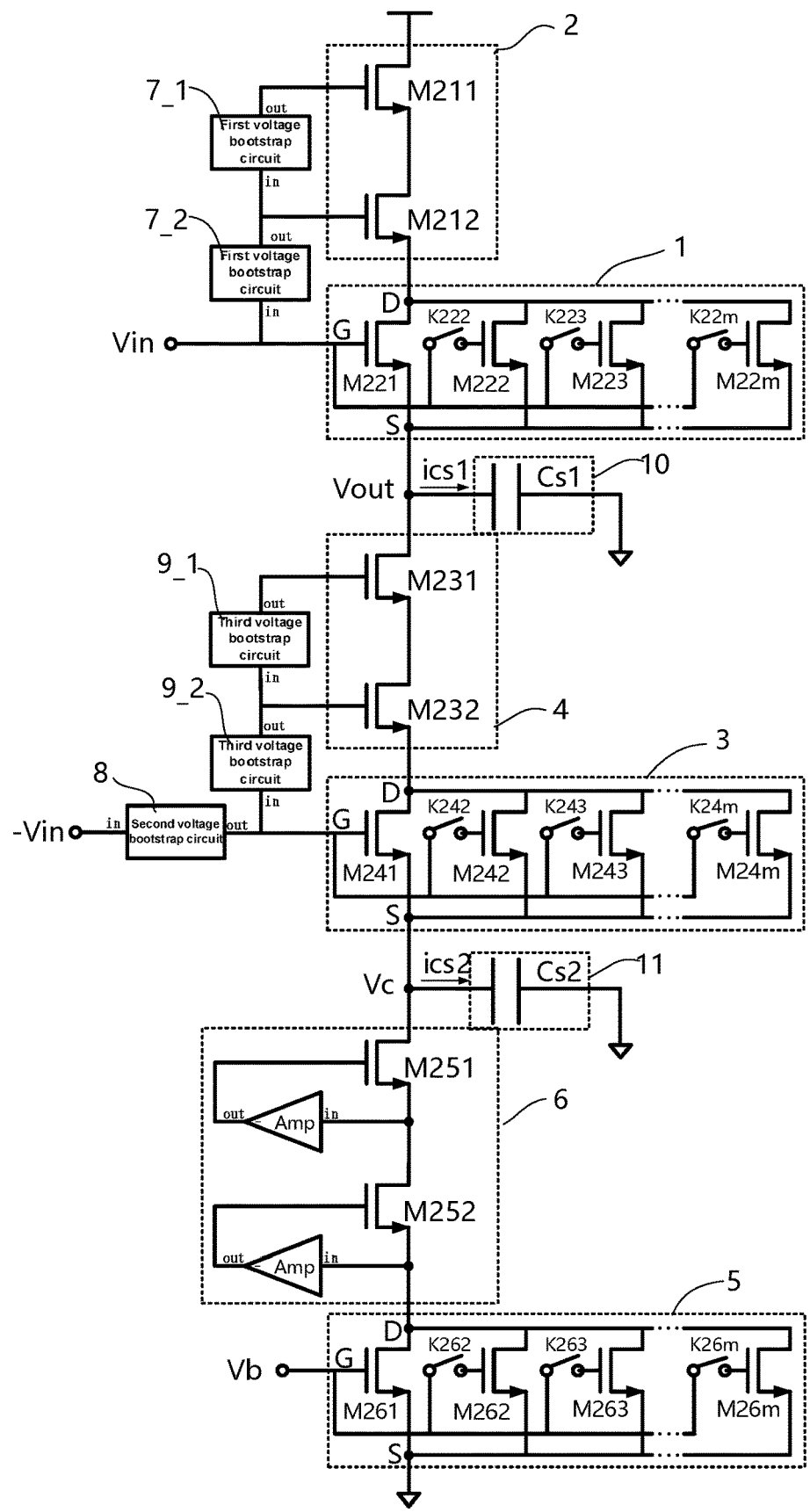
FIG. 4 shows a circuit diagram of an input buffer to increase the stage number of input bootstrap according to an embodiment of the present disclosure.

Referring to FIG. 4, which is a circuit diagram of an input buffer to increase the number of input bootstrap stages according to an embodiment of the present disclosure.

Embodiment 2 has the following differences from embodiment 1.

When the input follower linearity boosting circuit includes two NMOS transistors (M211 and M212), the corresponding first voltage bootstrap circuit includes two first voltage bootstrap subcircuits (voltage bootstrap circuit 7-1 and bootstrap circuit 7-2). The drain of the first NMOS transistor M211 is connected with the power supply voltage, the gate of the first NMOS transistor M211 is connected with the output end of the first one of the first voltage bootstrap subcircuits (voltage bootstrap circuit 7-1), the source of the first NMOS transistor M211 is connected with the drain of the second NMOS transistor M212. The gate of the second NMOS transistor M212 is connected between the output end of the second one of the first voltage bootstrap subcircuits (voltage bootstrap circuit 7-2) and the input end of the voltage bootstrap circuit 7-1. The source of the second NMOS transistor M212 is connected with the drain of the input follower circuit.

When the compensation follower linearity boosting circuit includes two NMOS transistors M23 (M231 and M232), the corresponding third voltage bootstrap circuit correspondingly includes two third voltage bootstrap subcircuits (voltage bootstrap circuit 9-1 and voltage bootstrap circuit 9-2). The drain of the first NMOS transistor M231 is connected with the source of the input follower circuit, the gate of the first NMOS transistor M231 is connected with the output end of the first one of the third voltage bootstrap subcircuits (voltage bootstrap circuit 9-1), and the source of the first NMOS transistor M231 is connected with the drain of the second NMOS transistor M232. The gate of the second NMOS transistor M232 is connected between the output end of the second one of the third voltage bootstrap subcircuits (voltage bootstrap circuit 9-2) and the input end of the voltage bootstrap circuit 9-1. The source of the second NMOS transistor M232 is connected with the drain of the compensation follower circuit.

The bias linearity boosting circuit includes two bias linearity boosting units. The S terminal of the first bias linearity boosting unit is connected with the D terminal of the second bias linearity boosting unit, the D terminal of the first bias linearity boosting unit is connected with the S terminal of the compensation follower circuit, and the S terminal of the second bias linearity boosting unit is connected with the D terminal of the bias circuit.

Based on the above embodiments, if the compensation follower linearity boosting circuit, the input follower linearity boosting circuit, and the bias linearity boosting circuit are all in multiple quantities, the details are as follows:

When the compensation follower linearity boosting circuit includes a plurality of NMOS transistors, the corresponding third voltage bootstrap circuit correspondingly includes a plurality of third voltage bootstrap subcircuits. The drain of the first NMOS transistor is connected with the source of the input follower circuit, the gate of the first NMOS transistor is connected with the output end of the first one of the third voltage bootstrap subcircuits, and the source of the first NMOS transistor is connected with the drain of the next NMOS transistor. The input end of the first one of the third voltage bootstrap subcircuits is respectively connected with the gate of the next NMOS transistor and the output end of the next third voltage bootstrap subcircuit, so that they are connected end to end. The input end of the last one of the third voltage bootstrap subcircuits is connected with the output end of the second voltage bootstrap circuit, and the source of the last NMOS transistor is connected with the D terminal of the compensation follower circuit.

When the input follower linearity boosting circuit includes a plurality of NMOS transistors, the corresponding first voltage bootstrap circuit correspondingly includes a plurality of first voltage bootstrap subcircuits. The drain of the first NMOS transistor is connected with the power supply voltage, the gate of the first NMOS transistor is connected with the output end of the first one of the first voltage bootstrap subcircuits, and the source of the first NMOS transistor is connected with the drain of the next NMOS transistor. The input end of the first one of the first voltage bootstrap subcircuits are respectively connected with the gate of the next NMOS transistor and the output end of the next first voltage bootstrap subcircuit, so that they are connected end to end. The input end of the last one of the first voltage bootstrap subcircuits is connected with the first input signal. The source of the last NMOS transistor is connected with the D terminal of the input follower circuit.

The bias linearity boosting circuit includes a plurality of bias linearity boosting units. The S terminal of the bias linearity boosting unit is connected with the D terminal of the next bias linearity boosting unit end to end, the D terminal of the first bias linearity boosting unit is connected with the S terminal of the compensation follower circuit, and the S terminal of the last bias linearity boosting unit is connected with the D terminal of the bias circuit.

By increasing the stage number of input bootstrap, including the current source and the follower module, the bootstrap voltage value is controlled more accurately, the accuracy of the input of the buffer circuit is improved, and the devices in the circuit are better protected.

Figure 5:
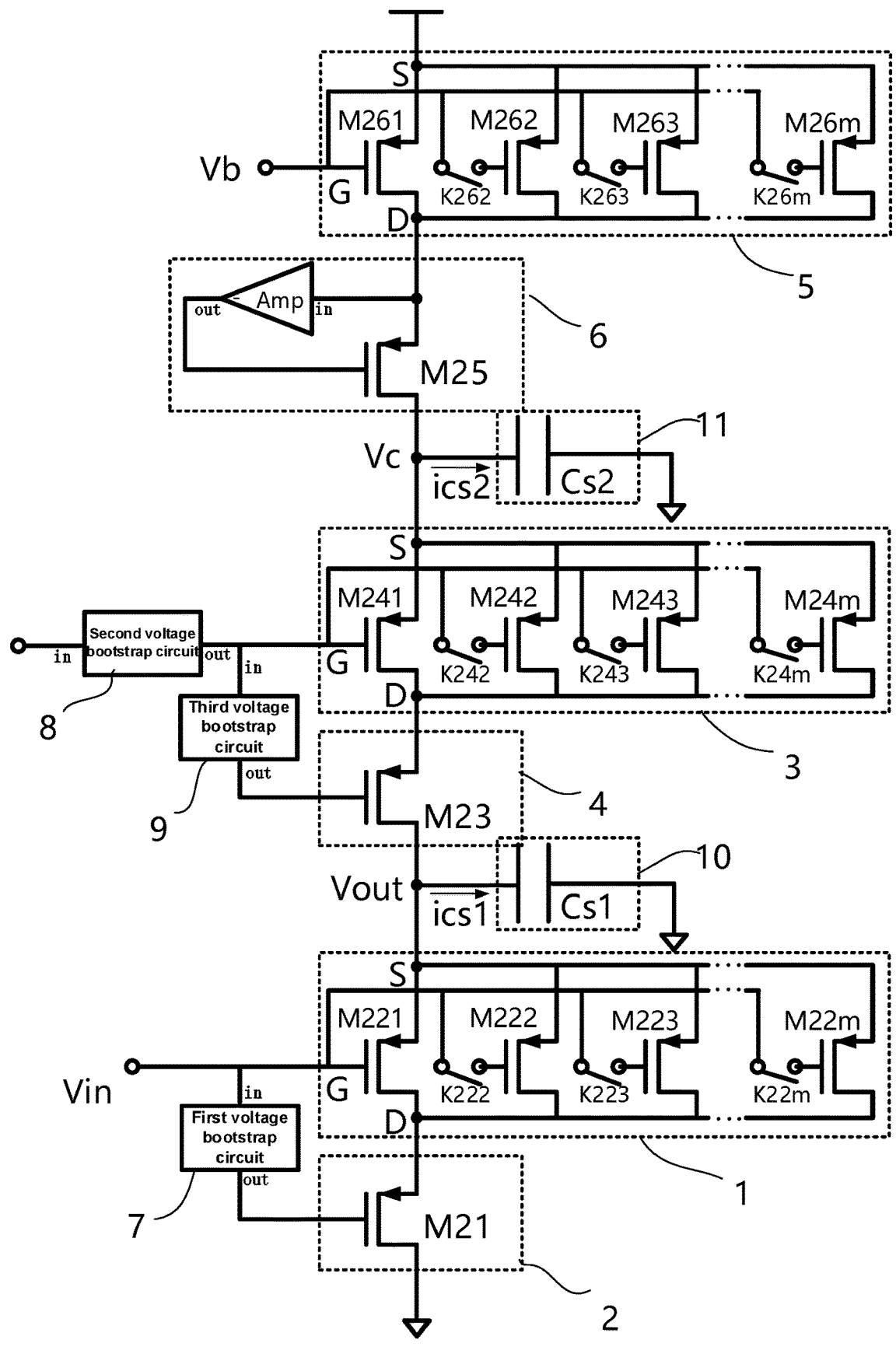
FIG. 5 shows a circuit diagram of an input buffer in the form of PMOS follower according to an embodiment of the present disclosure.

Referring to FIG. 5, which is a circuit diagram of an input buffer in the form of PMOS follower according to an embodiment of the present disclosure.

Compared to embodiment 1 or embodiment 2, in embodiment 3, the NMOS transistors are all replaced with PMOS transistors. NMOS transistors are turned on at a high level and turned off at a low level. On the contrary, PMOS transistors are turned on at a low level and turned off at a high level. Therefore, the S terminal of the bias circuit is connected with the power supply voltage, and the D terminal of the input follower linearity boosting circuit is connected with the ground. The replaced buffer circuit has the advantages as in embodiment 1.

Specifically, the input follower circuit includes m PMOS transistors and m−1 control switches. From the second PMOS transistor, the gate of each PMOS transistor is correspondingly connected with a control switch. The other end of all the control switches and the gate of the first PMOS transistor are connected with the first input signal. The sources of all PMOS transistors are connected with the compensation follower linearity boosting circuit, and the drains of all PMOS transistors are connected with the input follower linearity boosting circuit.

The input follower linearity boosting circuit 2 includes at least one PMOS transistor. When the input follower linearity boosting circuit 2 in FIG. 5 includes a PMOS transistor, the gate of the PMOS transistor is connected with an output end of the first voltage bootstrap circuit, the drain of the PMOS transistor is connected with the ground voltage, and the source of the PMOS transistor is connected with the D terminal of the input follower circuit.

When the input follower linearity boosting circuit 2 includes a plurality of PMOS transistors (the specific structure is not shown in the figure), the corresponding first voltage bootstrap circuit correspondingly includes a plurality of first voltage bootstrap subcircuits. The drain of the first PMOS transistor is connected with the ground voltage, the gate of the first PMOS transistor is connected with the output end of the first one of the first voltage bootstrap subcircuits, and the source of the first PMOS transistor is connected with the drain of the next PMOS transistor. The input end of the first one of the first voltage bootstrap subcircuits is respectively connected with the gate of the next PMOS transistor and the output end of the next the first voltage bootstrap subcircuit. The input end of the last one of the first voltage bootstrap subcircuits is connected with the first input signal. The source of the last PMOS transistor is connected with the D terminal of the input follower circuit.

The compensation follower circuit 3 includes m PMOS transistors and m−1 control switches. From the second NMOS transistor, the gate of each PMOS transistor is correspondingly connected with a control switch. The other end of all the control switches and the gate of the first PMOS transistor are connected with the second input signal being bootstrapped by the second voltage bootstrap circuit. The sources of all PMOS transistors are connected with the bias linearity boosting circuit, and the drains of all PMOS transistors are connected with the compensation follower linearity boosting circuit.

The compensation follower linearity boosting circuit 4 is at least one PMOS transistor. As shown in FIG. 5, when the compensation follower linearity boosting circuit 4 includes a PMOS transistor, the gate of the PMOS transistor is connected with the output end of the third voltage bootstrap circuit, the drain of the PMOS transistor is connected with the S terminal of the input follower circuit, and the source of the PMOS transistor is connected with the D terminal of the compensation follower circuit.

When the compensation follower linearity boosting circuit includes a plurality of PMOS transistors (the specific structure is not shown in the figure), the corresponding third voltage bootstrap circuit correspondingly includes a plurality of third voltage bootstrap subcircuits. The drain of the first PMOS transistor is connected with the S terminal of the input follower circuit, the gate of the first PMOS transistor is connected with the output end of the first one of the third voltage bootstrap subcircuits, and the source of the first PMOS transistor is connected with the drain of the next PMOS transistor. The input end of the first one of the third voltage bootstrap subcircuits is respectively connected with the gate of the next PMOS transistor and the output end of the next third voltage bootstrap subcircuit. The input end of the last one of the third voltage bootstrap subcircuits is connected with the output end of the second voltage bootstrap circuit, and the source of the last PMOS transistor is connected with the D terminal of the compensation follower circuit.

The bias circuit 5 includes m PMOS transistors and m−1 control switches. From the second PMOS transistor, the gate of each PMOS transistor is correspondingly connected with a control switch. The other end of all the control switches and the gate of the first PMOS transistor are connected with the bias voltage. The sources of all PMOS transistors are connected with the power supply voltage, and the drains of all PMOS transistors are connected with the bias linearity boosting circuit.

The bias linearity boosting circuit 6 at least includes a bias linearity boosting unit, and each bias linearity boosting unit includes an amplifier and a PMOS transistor. The input end and output end of the amplifier are correspondingly connected with the source and gate of the PMOS transistor. The source of the PMOS transistor is connected with the bias circuit, and the drain of the PMOS transistor is connected with the compensation follower circuit.

The bias linearity boosting circuit 6 may include a plurality of bias linearity boosting units (the specific structure is not shown in the figure). The S terminal of the bias linearity boosting unit is connected with the D terminal of the next bias linearity boosting unit end to end, the D terminal of the first bias linearity boosting unit is connected with the S terminal of the compensation follower circuit, and the S terminal of the last bias linearity boosting unit is connected with the D terminal of the bias circuit.

Figure 6:
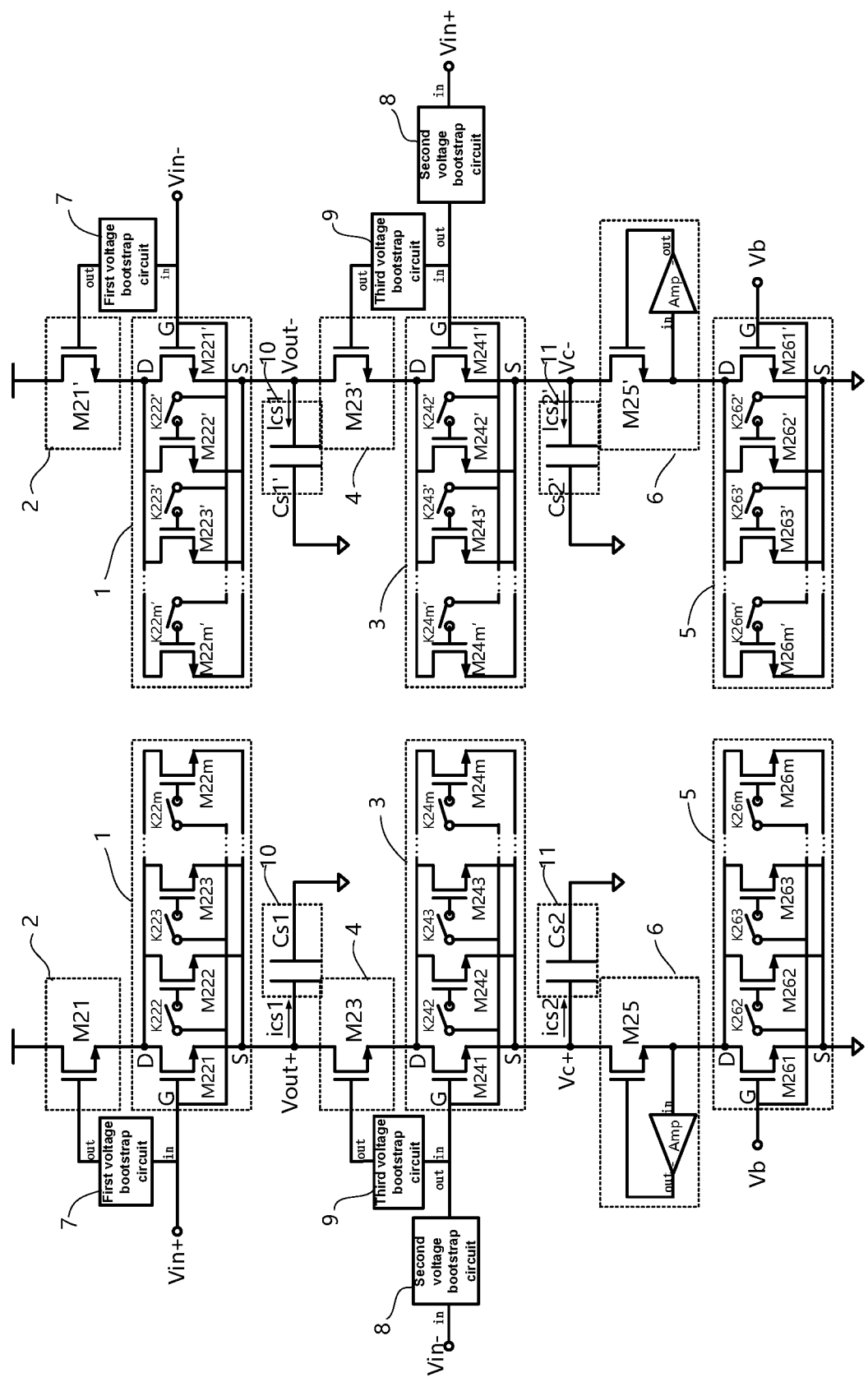
FIG. 6 shows a circuit diagram of an input buffer in a differential form based on FIG. 3 according to an embodiment of the present disclosure.

In this embodiment, FIG. 5 uses a PMOS follower form, which can be expanded based on FIG. 3, FIG. 4, or FIG. 6. The NMOS transistors are all replaced with PMOS transistors of the same type.

Referring to FIG. 6, which is a circuit diagram of an input buffer in a differential form according to an embodiment of the present disclosure.

In embodiment 4, compared to embodiment 1, the buffer circuit generates two nonlinear compensation currents in a differential form. The first input signal (Vin+) and the second input signal (Vin−) form a symmetric circuit correspondingly in a differential manner based on the circuit structure of the original embodiment 1. Since the differential mode can be used to suppress the common mode signal, at the same time, because the first input signal is followed by the input follower circuit in the buffer circuit, the first current is generated on the first load, the second input signal adjusts the voltage through the second voltage bootstrap circuit 8 and the third voltage bootstrap circuit 9, and the compensation follower circuit follows the second load to generate the second current. The AC voltages of the first load and the second load are equal in the opposite direction, if the impedances of the two loads are the same, the first current and the second current are also the same in the opposite direction. The sum of the AC currents flowing out of the input follower circuit is zero, thereby ensuring that the current of the input follower circuit does not change with the change of the input signal, so there is no following nonlinearity. Without increasing the current, the input follower circuit of the present disclosure has no nonlinearity. Compared with the traditional input buffer, the linearity is improved by more than 10 dB, which saves about 70% of power consumption.

Besides, based on the above, two nonlinear compensation currents are generated in a differential form, and two nonlinear compensation currents can be generated by mirroring based on FIG. 4 or FIG. 5. A nonlinear compensation current can be generated in a single-ended form.

The present disclosure provides a buffer. The buffer may include one or more buffer circuits in the foregoing multiple embodiments, it has corresponding advantages in the buffer circuit, and details are not repeated herein.

In summary, in the input buffer of the present disclosure, the channel-modulation effect is avoided through the drain-source voltages of the constant input follower circuit and the compensation follower circuit, which is particularly suitable for small-sized processes. At the same time, in the buffer circuit, the first input signal is followed by the input follower circuit to generate a first current on the first load, the second input signal adjusts the voltage through the second and third voltage bootstrap circuits and the compensation follower circuit follows the second load to generate a second current. The AC voltages of the first load and the second load are equal in the opposite direction, if the impedances of the two loads are the same, the first current and the second current are also the same in the opposite direction. The sum of the AC currents flowing out of the input follower circuit is zero, thereby ensuring that the current of the input follower circuit does not change with the change of the input signal, so there is no following nonlinearity. Without increasing the current, the input follower circuit of the present disclosure has no nonlinearity. Compared with the traditional input buffer, the linearity is improved by more than 10 dB, which saves about 70% of power consumption.

The number of components in the input follower circuit, the compensation follower circuit, and the bias circuit of the present disclosure are adjusted by the number of switches being turned on and off, to achieve a compromise design between the buffer output impedance and power consumption. When the input signal frequency is low, the number of components in the input follower circuit, compensation follower circuit, and bias circuit can be reduced to achieve lower power consumption. When the input signal frequency is high, the number of components in the input follower circuit, compensation follower circuit, and bias circuit can be increased to achieve a lower output impedance. Therefore, the present disclosure effectively overcomes various shortcomings in the existing technology and has high industrial utilization value.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

We claim:

1. A buffer circuit, wherein the buffer circuit is applied to an input buffer and comprises:
   an input follower circuit, an input end of the input follower circuit is connected with a first input signal to follow a voltage change of the first input signal;
   an input follower linearity boosting circuit connected with the input follower circuit and a first voltage bootstrap circuit, to improve follower linearity of the input follower circuit;
   the first voltage bootstrap circuit connected between the first input signal and the input follower linearity boosting circuit, a difference between an output voltage and an input voltage of the first voltage bootstrap circuit is a fixed level, to provide a corresponding quiescent operation point voltage for the input follower linearity boosting circuit;
   a second voltage bootstrap circuit, an input end of the second voltage bootstrap circuit is connected with a second input signal, and an output end of the second voltage bootstrap circuit is connected with an input end of a compensation follower circuit, a difference between an output voltage and an input voltage of the second voltage bootstrap circuit is a fixed level, to provide a corresponding quiescent operation point for the compensation follower circuit, wherein the second input signal and the first input signal are equal in magnitude and opposite in direction;
   a third voltage bootstrap circuit, an input end of the third voltage bootstrap circuit is connected with the output end of the second voltage bootstrap circuit, to provide a corresponding quiescent operation point voltage for a compensation follower linearity boosting circuit;
   the compensation follower circuit, the input end of the compensation follower circuit is connected with the output end of the second voltage bootstrap circuit, to follow a compensation voltage being bootstrapped by the second voltage bootstrap circuit;
   the compensation follower linearity boosting circuit, an input end of which is connected with an output end of the third voltage bootstrap circuit, to improve follower linearity of the compensation follower circuit;
   a first load connected in parallel between the input follower circuit and the compensation follower linearity boosting circuit to collect a buffered voltage;
   a bias circuit, an input end of the bias circuit is connected with a bias voltage, to provide a bias current for the buffer;
   a bias linearity boosting circuit connected between the compensation follower circuit and the bias circuit, to improve linearity of the bias circuit; and a second load connected in parallel between the compensation follower circuit and the bias linearity boosting circuit to generate a nonlinear compensation current.

2. The buffer circuit according to claim 1, wherein the input follower circuit comprises m NMOS transistors, m being a natural number, and m-1 control switches; from a second NMOS transistor of the m NMOS transistors, a gate of each NMOS transistor is correspondingly connected with a control switch; the other end of each of all control switches and a gate of a first NMOS transistor are connected with the first input signal; sources of all NMOS transistors are connected with the compensation follower linearity boosting circuit, and drains of all NMOS transistors are connected with the input follower linearity boosting circuit.

3. The buffer circuit according to claim 1, wherein the input follower linearity boosting circuit includes at least one NMOS transistor.

4. The buffer circuit according to claim 3, wherein when the input follower linearity boosting circuit is an NMOS transistor, a gate of the NMOS transistor is connected with an output end of the first voltage bootstrap circuit, a drain of the NMOS transistor is connected with a power supply voltage, and a source of the NMOS transistor is connected with a drain terminal of the input follower circuit.

5. The buffer circuit according to claim 3, wherein when the input follower linearity boosting circuit includes a plurality of NMOS transistors, the corresponding first voltage bootstrap circuit correspondingly includes a plurality of first voltage bootstrap subcircuits; a drain of the first NMOS transistor is connected with the power supply voltage, a gate of the first NMOS transistor is connected with an output end of the first one of the plurality of first voltage bootstrap subcircuits, and a source of the first NMOS transistor is connected with a drain of the next NMOS transistor; an input end of the first one of the plurality of first voltage bootstrap subcircuits is respectively connected with a gate of the next NMOS transistor and an output end of the next first voltage bootstrap subcircuit, an input end of the last one of the plurality of first voltage bootstrap subcircuits is connected with the first input signal, a source of the last NMOS transistor is connected with the drain terminal of the input follower circuit.

6. The buffer circuit according to claim 1, wherein the input follower circuit comprises m PMOS transistors, m being a natural number, and m-1 control switches; from a second PMOS transistor of the m PMOS transistors, a gate of each PMOS transistor is correspondingly connected with a control switch; the other end of each of all control switches and a gate of a first PMOS transistor are connected with the first input signal; sources of all PMOS transistors are connected with the compensation follower linearity boosting circuit, and drains of all PMOS transistors are connected with the input follower linearity boosting circuit.

7. The buffer circuit according to claim 1, wherein the input follower linearity boosting circuit includes at least one PMOS transistor.

8. The buffer circuit according to claim 7, wherein when the input follower linearity boosting circuit is a PMOS transistor, a gate of the PMOS transistor is connected with an output end of the first voltage bootstrap circuit, a drain of the PMOS transistor is connected with a ground voltage, and a source of the PMOS transistor is connected with a drain terminal of the input follower circuit.

9. The buffer circuit according to claim 7, wherein when the input follower linearity boosting circuit includes a plurality of PMOS transistors, the corresponding first voltage bootstrap circuit correspondingly includes a plurality of first voltage bootstrap subcircuits; a drain of the first PMOS transistor is connected with a ground voltage, a gate of the first PMOS transistor is connected with an output end of the first one of the plurality of first voltage bootstrap subcircuits, and a source of the first PMOS transistor is connected with a drain of the next PMOS transistor; an input end of the first one of the plurality of first voltage bootstrap subcircuits is respectively connected with a gate of the next PMOS transistor and an output end of the next first voltage bootstrap subcircuit, an input end of the last one of the plurality of first voltage bootstrap subcircuits is connected with the first input signal, a source of the last PMOS transistor is connected with the drain terminal of the input follower circuit.

10. The buffer circuit according to claim 1, wherein an input end of the first voltage bootstrap circuit is connected with the first input signal, and an output end of the first voltage bootstrap circuit is connected with a gate terminal of the input follower linearity boosting circuit; a voltage difference between a drain terminal and a source terminal of the input follower circuit is a fixed level to eliminate a channel modulation effect of the input follower circuit and improve linearity of the input follower circuit.

11. The buffer circuit according to claim 1, wherein the compensation follower circuit comprises m NMOS transistors, m being a natural number, and m-1 control switches; from a second NMOS transistor of the m NMOS transistors, a gate of each NMOS transistor is correspondingly connected with a control switch; the other end of each of all control switches and a gate of a first NMOS transistor are connected with the second input signal being bootstrapped by the second voltage bootstrap circuit; sources of all NMOS transistors are connected with the bias linearity boosting circuit, and drains of all NMOS transistors are connected with the compensation follower linearity boosting circuit.

12. The buffer circuit according to claim 1, wherein the compensation follower linearity boosting circuit includes at least one NMOS transistor.

13. The buffer circuit according to claim 12, wherein when the compensation follower linearity boosting circuit includes an NMOS transistor, a gate of the NMOS transistor is connected with the output end of the third voltage bootstrap circuit, a drain of the NMOS transistor is connected with a source terminal of the input follower circuit, and a source of the NMOS transistor is connected with a drain terminal of the compensation follower circuit.

14. The buffer circuit according to claim 12, wherein when the compensation follower linearity boosting circuit includes a plurality of NMOS transistors, the corresponding third voltage bootstrap circuit correspondingly includes a plurality of third voltage bootstrap subcircuits; a drain of the first NMOS transistor is connected with a source terminal of the input follower circuit, a gate of the first NMOS transistor is connected with an output end of the first one of the third voltage bootstrap subcircuits, and a source of the first NMOS transistor is connected with a drain of the next NMOS transistor; an input end of the first one of the third voltage bootstrap subcircuits is respectively connected with a gate of the next NMOS transistor and an output end of the next third voltage bootstrap subcircuit, an input end of the last one of the third voltage bootstrap subcircuits is connected with the output end of the second voltage bootstrap circuit, and a source of the last NMOS transistor is connected with a drain terminal of the compensation follower circuit.

15. The buffer circuit according to claim 1, wherein the compensation follower circuit comprises m PMOS transistors, m being a natural number, and m-1 control switches; from a second PMOS transistor of the m PMOS transistors, a gate of each PMOS transistor is correspondingly connected with a control switch; the other end of each of all control switches and a gate of a first PMOS transistor are connected with the second input signal being bootstrapped by the second voltage bootstrap circuit; sources of all PMOS transistors are connected with the bias linearity boosting circuit, and drains of all PMOS transistors are connected with the compensation follower linearity boosting circuit.

16. The buffer circuit according to claim 1, wherein the compensation follower linearity boosting circuit includes at least one PMOS transistor.

17. The buffer circuit according to claim 16, wherein when the compensation follower linearity boosting circuit includes a PMOS transistor, a gate of the PMOS transistor is connected with the output end of the third voltage bootstrap circuit, a drain of the PMOS transistor is connected with a source terminal of the input follower circuit, and a source of the PMOS transistor is connected with a drain terminal of the compensation follower circuit.

18. The buffer circuit according to claim 16, wherein when the compensation follower linearity boosting circuit includes a plurality of PMOS transistors, the corresponding third voltage bootstrap circuit correspondingly includes a plurality of third voltage bootstrap subcircuits; a drain of the first PMOS transistor is connected with a source terminal of the input follower circuit, a gate of the first PMOS transistor is connected with an output end of the first one of the third voltage bootstrap subcircuits, and a source of the first PMOS transistor is connected with a drain of the next PMOS transistor; an input end of the first one of the third voltage bootstrap subcircuits is respectively connected with a gate of the next PMOS transistor and an output end of the next the third voltage bootstrap subcircuit, an input end of the last one of the third voltage bootstrap subcircuits is connected with the output end of the second voltage bootstrap circuit, and a source of the last PMOS transistor is connected with a drain terminal of the compensation follower circuit.

19. The buffer circuit according to claim 1, wherein the compensation follower linearity boosting circuit, the second voltage bootstrap circuit, and the third voltage bootstrap circuit together ensure a voltage difference between a drain terminal and a source terminal of the compensation follower circuit is a fixed level to eliminate a channel modulation effect of the compensation follower circuit and improve linearity of the compensation follower circuit.

20. The buffer circuit according to claim 1, wherein the bias circuit comprises m NMOS transistors, m being a natural number, and m-1 control switches; from a second NMOS transistor of the m NMOS transistors, a gate of each NMOS transistor is correspondingly connected with a control switch; the other end of each of all control switches and a gate of a first NMOS transistor are connected with a bias voltage; sources of all NMOS transistors are grounded, and drains of all NMOS transistors are connected with the bias linearity boosting circuit.

21. The buffer circuit according to claim 1, wherein the bias linearity boosting circuit at least includes a bias linearity boosting unit, and each bias linearity boosting unit includes an amplifier and a NMOS transistor, an input end and an output end of the amplifier are correspondingly connected with a source and a gate of the NMOS transistor, the source of the NMOS transistor is connected with the bias circuit, and a drain of the NMOS transistor is connected with the compensation follower circuit.

22. The buffer circuit according to claim 1, wherein the bias circuit comprises m PMOS transistors, m being a natural number, and m-1 control switches; from a second PMOS transistor of the m PMOS transistors, a gate of each PMOS transistor is correspondingly connected with a control switch; the other end of each of all control switches and a gate of a first PMOS transistor are connected with a bias voltage; sources of all PMOS transistors are connected with a power supply voltage, and drains of all PMOS transistors are connected with the bias linearity boosting circuit.

23. The buffer circuit according to claim 1, wherein the bias linearity boosting circuit at least includes a bias linearity boosting unit, and each bias linearity boosting unit includes an amplifier and a PMOS transistor, an input end and an output end of the amplifier are correspondingly connected with a source and a gate of the PMOS transistor, the source of the PMOS transistor is connected with the bias circuit, and a drain of the PMOS transistor is connected with the compensation follower circuit.

24. The buffer circuit according to claim 21, wherein the bias linearity boosting circuit includes a plurality of bias linearity boosting units, a source terminal of the bias linearity boosting unit is connected with a drain terminal of the next bias linearity boosting unit end to end, a drain terminal of the first bias linearity boosting unit is connected with a source terminal of the compensation follower circuit, and a source of the last bias linearity boosting unit is connected with a drain terminal of the bias circuit.

25. The buffer circuit according to claim 1, wherein the input follower circuit, the compensation follower circuit, and the bias circuit adjust an output impedance and power consumption of the buffer by the number of switches being turned on and off.

26. The buffer circuit according to claim 25, wherein the switches K222, K242, and K262 are simultaneously turned on or off, and the switches K223, K243, and K263 are simultaneously turned on or off, . . . , K22$m$, K24$m$, and K26$m$ are simultaneously turned on or off.

27. The buffer circuit according to claim 1, wherein the second load has the same impedance as the first load to compensate for a non-linear current extracted by the first load from the input follower circuit.

28. The buffer circuit according to claim 27, wherein the first load is a load capacitor, and the second load is a compensation capacitor.

29. A buffer circuit, adopting a buffer circuit applied to an input buffer, and the adopted buffer circuit comprises:
an input follower circuit, an input end of the input follower circuit is connected with a first input signal to follow a voltage change of the first input signal;
an input follower linearity boosting circuit connected with the input follower circuit and a first voltage bootstrap circuit, to improve follower linearity of the input follower circuit;
the first voltage bootstrap circuit connected between the first input signal and the input follower linearity boosting circuit, a difference between an output voltage and an input voltage of the first voltage bootstrap circuit is a fixed level, to provide a corresponding quiescent operation point voltage for the input follower linearity boosting circuit;
a second voltage bootstrap circuit, an input end of the second voltage bootstrap circuit is connected with a second input signal, and an output end of the second voltage bootstrap circuit is connected with an input end of a compensation follower circuit, a difference between an output voltage and an input voltage of the second voltage bootstrap circuit is a fixed level, to provide a corresponding quiescent operation point for the compensation follower circuit, wherein the second input signal and the first input signal are equal in magnitude and opposite in direction;

a third voltage bootstrap circuit, an input end of the third voltage bootstrap circuit is connected with the output end of the second voltage bootstrap circuit, to provide a corresponding quiescent operation point voltage for a compensation follower linearity boosting circuit;

the compensation follower circuit, the input end of the compensation follower circuit is connected with the output end of the second voltage bootstrap circuit, to follow a compensation voltage being bootstrapped by the second voltage bootstrap circuit;

the compensation follower linearity boosting circuit, an input end of which is connected with an output end of the third voltage bootstrap circuit, to improve follower linearity of the compensation follower circuit;

a first load connected in parallel between the input follower circuit and the compensation follower linearity boosting circuit to collect a buffered voltage;

a bias circuit, an input end of the bias circuit is connected with a bias voltage, to provide a bias current for the buffer;

a bias linearity boosting circuit connected between the compensation follower circuit and the bias circuit, to improve linearity of the bias circuit; and a second load connected in parallel between the compensation follower circuit and the bias linearity boosting circuit to generate a nonlinear compensation current;

wherein the buffer circuit generates one or two nonlinear compensation currents in a differential or single-ended form.

30. A buffer, comprising a buffer circuit, wherein the buffer circuit is applied to an input buffer and comprises:

an input follower circuit, an input end of the input follower circuit is connected with a first input signal to follow a voltage change of the first input signal;

an input follower linearity boosting circuit connected with the input follower circuit and a first voltage bootstrap circuit, to improve follower linearity of the input follower circuit;

the first voltage bootstrap circuit connected between the first input signal and the input follower linearity boosting circuit, a difference between an output voltage and an input voltage of the first voltage bootstrap circuit is a fixed level, to provide a corresponding quiescent operation point voltage for the input follower linearity boosting circuit;

a second voltage bootstrap circuit, an input end of the second voltage bootstrap circuit is connected with a second input signal, and an output end of the second voltage bootstrap circuit is connected with an input end of a compensation follower circuit, a difference between an output voltage and an input voltage of the second voltage bootstrap circuit is a fixed level, to provide a corresponding quiescent operation point for the compensation follower circuit, wherein the second input signal and the first input signal are equal in magnitude and opposite in direction;

a third voltage bootstrap circuit, an input end of the third voltage bootstrap circuit is connected with the output end of the second voltage bootstrap circuit, to provide a corresponding quiescent operation point voltage for a compensation follower linearity boosting circuit;

the compensation follower circuit, the input end of the compensation follower circuit is connected with the output end of the second voltage bootstrap circuit, to follow a compensation voltage being bootstrapped by the second voltage bootstrap circuit;

the compensation follower linearity boosting circuit, an input end of which is connected with an output end of the third voltage bootstrap circuit, to improve follower linearity of the compensation follower circuit;

a first load connected in parallel between the input follower circuit and the compensation follower linearity boosting circuit to collect a buffered voltage;

a bias circuit, an input end of the bias circuit is connected with a bias voltage, to provide a bias current for the buffer;

a bias linearity boosting circuit connected between the compensation follower circuit and the bias circuit, to improve linearity of the bias circuit; and a second load connected in parallel between the compensation follower circuit and the bias linearity boosting circuit to generate a nonlinear compensation current.

* * * * *